(12) United States Patent
Kasai et al.

(10) Patent No.: US 11,535,015 B2
(45) Date of Patent: Dec. 27, 2022

(54) MOLDED PRODUCT, METAL-CLAD LAMINATE, PRINTED WIRING BOARD, AND METHODS FOR THEIR PRODUCTION

(71) Applicant: AGC Inc., Chiyoda-ku (JP)

(72) Inventors: Wataru Kasai, Chiyoda-ku (JP); Tomoya Hosoda, Chiyoda-ku (JP)

(73) Assignee: AGC Inc., Chiyoda-ku (JP)

( * ) Notice: Subject to any disclaimer, the term of this patent is extended or adjusted under 35 U.S.C. 154(b) by 51 days.

(21) Appl. No.: 16/808,502

(22) Filed: Mar. 4, 2020

(65) Prior Publication Data

US 2020/0198310 A1    Jun. 25, 2020

Related U.S. Application Data

(63) Continuation of application No. PCT/JP2018/039747, filed on Oct. 25, 2018.

(30) Foreign Application Priority Data

Oct. 31, 2017 (JP) .............................. JP2017-210717
Aug. 3, 2018 (JP) .............................. JP2018-147115

(51) Int. Cl.
  *B32B 3/24* (2006.01)
  *B32B 27/30* (2006.01)
  (Continued)

(52) U.S. Cl.
  CPC .............. *B32B 27/30* (2013.01); *B32B 3/266* (2013.01); *B32B 15/082* (2013.01); *C08J 5/18* (2013.01);
  (Continued)

(58) Field of Classification Search
  CPC ...................................................... B32B 3/266
  See application file for complete search history.

(56) References Cited

U.S. PATENT DOCUMENTS 4,314,260 A * 2/1982 Drexler .................. G11B 7/251
                                                          346/135.1
5,547,653 A * 8/1996 Webster .................... A62D 3/40
                                                          208/262.1
(Continued)

FOREIGN PATENT DOCUMENTS

| JP | 04-503081 A | 6/1994 |
| JP | 2001-007466 A | 1/2001 |
| JP | 2005-280064 A | 10/2005 |
| WO | WO 2006/067970 A1 | 6/2006 |
| WO | WO 2017/082315 A1 | 5/2017 |

OTHER PUBLICATIONS

International Search Report dated Jan. 29, 2019 in PCT/JP2018/039747 filed on Oct. 25, 2018, 2 pages.

*Primary Examiner* — William P Watkins, III
(74) *Attorney, Agent, or Firm* — Oblon, McClelland, Maier & Neustadt, L.L.P.

(57) ABSTRACT

To provide a molded product, a metal-clad laminate and a printed wiring board, each of which contains a tetrafluoroethylene type polymer, whereby an decrease in electrical characteristics is inhibited and a hole can be easily bored with UV-YAG laser; and methods for their production. A molded product containing a tetrafluoroethylene type polymer, in which the content of components other than the tetrafluoroethylene type polymer is at most 0.9 mass %, and which has a wavelength range where the extinction coefficient becomes to be from 1.2 to 4.5 at from 200 to 380 nm; and a method for its production. A metal-clad laminate having a conductive metal layer and a layer of the molded product; and a method for its production. A printed wiring board provided with the metal-clad laminate and having through-holes in the thickness direction of the polymer layer.

14 Claims, 1 Drawing Sheet

(51) Int. Cl.
  *B32B 15/082* (2006.01)
  *C08J 5/18* (2006.01)
  *H05K 1/03* (2006.01)
  *H05K 3/00* (2006.01)
  *H05K 3/02* (2006.01)
  *B32B 3/26* (2006.01)

(52) U.S. Cl.
  CPC ......... *H05K 1/0353* (2013.01); *H05K 3/0038* (2013.01); *H05K 3/022* (2013.01); *B32B 2457/08* (2013.01); *C08J 2327/18* (2013.01); *H05K 2201/015* (2013.01); *H05K 2203/107* (2013.01); *Y10T 428/24273* (2015.01); *Y10T 428/24322* (2015.01)

(56) References Cited

U.S. PATENT DOCUMENTS

| | | | | |
|---|---|---|---|---|
| 5,925,206 A | * | 7/1999 | Boyko | H05K 3/4652 |
| | | | | 156/150 |
| 2003/0058552 A1 | * | 3/2003 | Schreiner | G02B 26/0875 |
| | | | | 359/824 |
| 2006/0213881 A1 | * | 9/2006 | Oliphant | B23K 26/40 |
| | | | | 219/121.69 |
| 2016/0242274 A1 | * | 8/2016 | Hosoda | B32B 15/08 |
| 2018/0186914 A1 | | 7/2018 | Taguchi et al. | |

* cited by examiner

MOLDED PRODUCT, METAL-CLAD LAMINATE, PRINTED WIRING BOARD, AND METHODS FOR THEIR PRODUCTION

TECHNICAL FIELD

The present invention relates to a molded product, a metal-clad laminate and a printed wiring board, containing a tetrafluoroethylene type polymer, and methods for their production.

BACKGROUND ART

For a printed wiring board to be used to transmit high-frequency signals, it is required that transmission delay or transmission loss is small. To improve the transmission characteristics, as an insulating material for the electrical insulator layer of a printed wiring board, it is necessary to use a material, of which the dielectric constant and dielectric loss tangent are small. As a material, of which the dielectric constant and dielectric loss tangent are small, a tetrafluoroethylene type polymer is known.

In Patent Documents 1 and 2, a laminate for a printed wiring board is disclosed wherein a conductor and a film of a tetrafluoroethylene type polymer are laminated.

In a printed wiring board, it is often a case where through holes are formed in a laminate having conductors provided on both sides of an electrical insulator layer, and a plating layer is formed on the inner wall surfaces of the through holes to secure conduction between the conductors. In the processing to form holes, it has been common to use NC drilling, irradiation of carbon dioxide gas laser, etc. However, in recent years, the size of holes has been reduced in diameter along with the wiring rule miniaturization of printed wiring boards, and UV-YAG laser tends to be used.

A tetrafluoroethylene type polymer has a low absorption in a UV wavelength region. Therefore, in a printed wiring board having a layer of a tetrafluoroethylene type polymer, in the processing to form holes by UV-YAG laser, it is necessary to irradiate a high-power laser. By a high-power laser, the above-mentioned layer or conductors are likely to be deformed by heat generated during the processing, and delamination, etc. are likely to occur, whereby it is difficult to form through holes suitable for the formation of a plating layer.

Patent Document 3 discloses a method of improving the processability to form holes by UV-YAG laser, by improving the UV absorption of the film, by incorporating a UV absorber to a film of a tetrafluoroethylene type polymer. However, if a UV absorber is used, electric characteristics such as electrical insulation properties, of the tetrafluoroethylene type polymer tend to be reduced.

PRIOR ART DOCUMENTS

Patent Documents

Patent Document 1: JP-A-2001-007466
Patent Document 2: WO2006/067970
Patent Document 3: JP-A-H04-503081

DISCLOSURE OF INVENTION

Technical Problem

It is an object of the present invention to provide a molded product, laminate and printed wiring board, containing a tetrafluoroethylene type polymer, which can be easily bored by UV-YAG laser, while suppressing a decrease in the electrical characteristics, and methods for their production.

Solution to Problem

The present invention has the following embodiments.

[1] A method for producing a molded product, characterized by heat-molding a material which contains a tetrafluoroethylene type polymer and in which the content of components other than the tetrafluoroethylene type polymer is at most 0.9 mass %, in an atmosphere having an oxygen concentration of less than 10,000 ppm, to produce a molded product in which the content of said components other than the tetrafluoroethylene type polymer is at most 0.9 mass % and which has a wavelength region where the extinction coefficient becomes to be from 1.2 to 4.5, at from 200 to 380 nm.

[2] The production method according to [1], wherein the heat-molding is conducted in an atmosphere having an oxygen concentration of at most 1,000 ppm.

[3] The production method according to [1] or [2], wherein the molded product has an extinction coefficient of from 1.2 to 2.0 at a wavelength of 355 nm, or an extinction coefficient of from 2.0 to 4.5 at a wavelength of 266 nm.

[4] The production method according to any one of [1] to [3], wherein the tetrafluoroethylene type polymer is a melt-moldable polymer, and the temperature for heating the tetrafluoroethylene type polymer is from (Tm−15) to (Tm+100°) C where Tm is the melting point of the tetrafluoroethylene type polymer.

[5] The production method according to any one of [1] to [4], wherein the tetrafluoroethylene type polymer has at least one type of functional group selected from the group consisting of a carbonyl group-containing group, a hydroxy group, an epoxy group, an amide group, an amino group and an isocyanate group.

[6] A method for producing a metal-clad laminate, characterized by thermocompression bonding a conductive metal foil and a molded product which contains a tetrafluoroethylene type polymer, in which the content of components other than the tetrafluoroethylene type polymer is at most 0.9 mass %, and which has a wavelength region where the extinction coefficient becomes to be from 1.2 to 4.5, at from 200 to 380 nm, to produce a metal-clad laminate having a conductive metal layer and a layer of the molded product.

[7] A method for producing a metal-clad laminate, characterized by applying, on the surface of a conductive metal foil, a liquid composition comprising a liquid medium and a material which contains a tetrafluoroethylene type polymer and in which the content of components other than the tetrafluoroethylene type polymer is at most 0.9 mass %, and removing the liquid medium and, at the same time, heating in an atmosphere having an oxygen concentration of less than 10,000 ppm, to let the tetrafluoroethylene type polymer be fusion-bonded to the conductive metal foil, to produce a metal-clad laminate having a conductive metal layer and a layer of a molded product in which the content of components other than the tetrafluoroethylene type polymer is at most 0.9 mass %, and which has a wavelength region where the extinction coefficient becomes to be from 1.2 to 4.5, at from 200 to 380 nm.

[8] A molded product which contains a tetrafluoroethylene type polymer, in which the content of components other than the tetrafluoroethylene type polymer is at most 0.9 mass %, and which has a wavelength region where the extinction coefficient becomes to be from 1.2 to 4.5, at from 200 to 380 nm.

[9] The molded product according to [8], wherein the molded product has an extinction coefficient of from 1.2 to 2.0 at a wavelength of 355 nm, or an extinction coefficient of from 2.0 to 4.5 at a wavelength of 266 nm.

[10] The molded product according to [8] or [9], wherein the tetrafluoroethylene type polymer has at least one type of functional group selected from the group consisting of a carbonyl group-containing group, a hydroxy group, an epoxy group, an amide group, an amino group and an isocyanate group.

[11] The molded product according to any one of [8] to [10], wherein the tetrafluoroethylene type polymer is a melt-moldable polymer.

[12] The molded product according to any one of [8] to [11], wherein the molded product is a film.

[13] A metal-clad laminate having a conductive metal layer and a layer of a molded product which contains a tetrafluoroethylene type polymer, in which the content of components other than the tetrafluoroethylene type polymer is at most 0.9 mass %, and which has a wavelength region where the extinction coefficient becomes to be from 1.2 to 4.5, at from 200 to 380 nm.

[14] A printed wiring board having a conductive metal layer and a layer of a molded product which contains a tetrafluoroethylene type polymer, in which the content of components other than the tetrafluoroethylene type polymer is at most 0.9 mass %, and which has a wavelength region where the extinction coefficient becomes to be from 1.2 to 4.5, at from 200 to 380 nm, and having through holes in the thickness direction of the layers.

[15] A method for producing a printed wiring board, characterized by irradiating the metal-clad laminate as defined in [13] with UV-YAG laser to form through holes in the thickness direction of the metal-clad laminate.

Advantageous Effects of Invention

According to the present invention, while suppressing a decrease in the electrical characteristics of a printed wiring board, it is possible to easily conduct boring processing by UV-YAG laser.

DESCRIPTION OF EMBODIMENTS

The following definitions of terms apply throughout the specification and claims.

The "extinction coefficient" in each embodiment can be calculated from the following formulae (1) and (2) by using the film.

$$\text{Extinction coefficient} = Ar/0.434/L \quad (1)$$

$$Ar = -\log_{10}(T/100) \quad (2)$$

Here, the symbols in the formulae have the following meanings.

Ar: absorbance to light with a wavelength selected from 200 to 380 nm

L: film thickness (mm)

T: light transmittance of the film to light with a wavelength selected from 200 to 380 nm.

"$Rz_{JIS}$" is a ten-point average roughness defined by JIS B 0601: 2013 Annex JA.

A "melt moldable polymer" means a polymer where there is a temperature at which the melt flow rate of the polymer becomes to be from 0.1 to 1,000 g/10 min, at a temperature higher by at least 20° C. than the melting point of the polymer, under a condition of a load of 49N.

The "melting point" means the temperature corresponding to the maximum value of the melting peak of a polymer as measured by a differential scanning calorimetry (DSC) method.

The "melt flow rate" is the melt mass flow rate (MFR) which is defined by JIS K 7210-1: 2014 (corresponding to International Standard ISO 1133-1:2011).

"D50" is a particle diameter (volume cumulative 50% diameter) at a point where at the time of measuring the particle size distribution of a powder by a laser diffraction scattering method, and obtaining the cumulative curve when the total volume of the population of powder particles is taken as 100%, the cumulative volume becomes 50% on the cumulative curve.

A "unit based on a monomer" is a generic term for an atomic group which is directly formed by polymerization of one molecule of the monomer, and an atomic group obtainable by chemical transformation of a part of the above atomic group.

A "conductor/layer of a polymer/layer of a heat-resistant resin" representing a layered structure, shows that a conductor, a layer of a polymer and a layer of a heat-resistant resin are laminated in this order, and the same applies to other layered structures.

"UV-YAG laser" is meant for light of the third harmonic (wavelength: 355 nm) or fourth harmonic (wavelength: 266 nm).

The "dielectric loss tangent" is a value measured at a frequency of 10 GHz in an environment within ranges of 23° C.±2° C. and 50±5% RH by setting each film by the perturbation method cavity resonator method, using a Fabry-Perot resonator and a vector network analyzer (manufactured by KEYCOM Corporation).

The molded product of the present invention contains a tetrafluoroethylene type polymer (hereinafter referred to also as a "TFE type polymer"), wherein the content of components other than the TFE type polymer, is at most 0.9 mass %.

The molded product has at least a region where the extinction coefficient at a wavelength of from 200 to 380 nm becomes to be from 1.2 to 4.5, and preferably has an extinction coefficient at a wavelength of 355 nm (hereinafter referred to also as "α") of from 1.2 to 2.0, or an extinction coefficient at a wavelength of 266 nm (hereinafter referred to also as "β") of from 2.0 to 4.5. In such a case, not only it will be easy to form holes by UV-YAG laser in a printed wiring board formed from the molded product, but also the electrical characteristics will be excellent.

α is preferably more than 1.2 and less than 2.0, more preferably from 1.4 to 1.8.

β is preferably more than 1.8 and at most 4.2, more preferably at least 2.0 and less than 3.5, particularly preferably at least 2.3 and less than 3.2.

The dielectric loss tangent of the molded product is preferably from 0.0005 to 0.0020, particularly preferably from 0.0007 to 0.0015. The lower the dielectric loss tangent of the molded product, the better the electrical characteristics of the printed wiring board formed from the molded product.

The molded product may consist of only a TFE type polymer, or may contain a TFE type polymer and components other than the TFE type polymer, and it preferably consists of only a TFE type polymer. In such a case, not only the electrical characteristics of the molded product, but adhesion to another substrate, etc., of the molded product will be more excellent.

The molded product consisting of only a TFE type polymer means that components other than the TFE type polymer are not incorporated as components constituting the molded product, and normally means that the content of other components in the molded product is 0 mass %.

Other components may be a UV absorber, carbon black, a liquid crystal polymer, a polyimide, a polyamideimide, and a polyphenylene oxide. The content of other components is preferably at most 0.5 mass %, more preferably at most 0.3 mass %, to the total mass of the molded product.

The TFE type polymer is a polymer comprising units (hereinafter referred to also as "TFE units") based on tetrafluoroethylene (hereinafter referred to also as "TFE").

The TFE type polymer is preferably a melt-moldable TFE type polymer, from the viewpoint of such moldability that it can be easily molded into a film.

The melt flow rate of the TFE type polymer is preferably from 0.5 to 100 g/10 min, more preferably from 1 to 30 g/10 min, further preferably from 5 to 20 g/10 min. In such a case, it is excellent in moldability, and a molded product (such as a film) excellent in appearance such as surface smoothness and mechanical strength is easily obtainable.

The melting point (hereinafter referred to also as "Tm") of the TFE type polymer is preferably from 100 to 325° C., more preferably from 250 to 320° C., further preferably from 280 to 315° C. In such a case, heat resistance of the molded product and productivity of the molded product will be excellent.

The fluorine content of the TFE type polymer is preferably from 70 to 80 mass %, particularly preferably from 70 to 78 mass %. In such a case, the electrical characteristics of the molded product, and the moldability of the molded product will be excellent. Here, the fluorine content is a proportion of the total mass of fluorine atoms to the total mass of the TFE type polymer. The fluorine content can be measured by an elemental analysis.

The TFE type polymer preferably has at least one type of functional group selected from the group consisting of a carbonyl group-containing group, a hydroxy group, an epoxy group, an amide group, an amino group and an isocyanate group. Here, the "carbonyl group-containing group" means a group having a carbonyl group in the structure.

The functional group in the TFE type polymer may be present as a pendant group in the polymer main chain, or may be present as a terminal group in the polymer main chain.

As a TFE type polymer having functional groups as pendant groups in the polymer main chain, a polymer comprising TFE units and units based on a monomer having the functional group, may be mentioned.

As a TFE type polymer having functional groups as terminal groups in the polymer main chain, a TFE type polymer obtainable by polymerization using a chain transfer agent or polymerization initiator to provide the functional groups, or a TFE type polymer which is treated by the plasma treatment, etc. may be mentioned.

As the chain transfer agent to provide the functional groups, acetic acid, acetic anhydride, methyl acetate, ethylene glycol, or propylene glycol may be exemplified.

As the polymerization initiator to provide the functional groups, di-n-propyl peroxydicarbonate, diisopropyl peroxydicarbonate, tert-butylperoxy isopropyl carbonate, bis(4-tert-butylcyclohexyl) peroxydicarbonate, or di-2-ethylhexyl peroxydicarbonate may be exemplified.

The TFE type polymer may be a polytetrafluoroethylene (homopolymer of TFE), or may be a polymer comprising units based on TFE units and units based on a fluoromonomer other than TFE.

As the fluoromonomer other than TFE, vinyl fluoride, vinylidene fluoride, a fluoro-olefin such as trifluoroethylene, hexafluoropropylene (hereinafter referred to also as "HFP") or hexafluoroisobutylene, a perfluoro(alkyl vinyl ether) (hereinafter referred to also as "PAVE"), a fluorovinyl ether having a functional group, a fluoro(divinyl ether), a polyfluoro(alkyl ethylene) (hereinafter referred to also as "FAE"), or a fluoromonomer having a ring structure, may be mentioned.

As PAVE, $CF_2=CFOCF_3$, $CF_2=CFOCF_2CF_3$, $CF_2=CFOCF_2CF_2CF_3$ (hereinafter referred to also as "PPVE"), $CF_2=CFOCF_2CF_2CF_2CF_3$, or $CF_2=CFO(CF_2)_6F$, may be exemplified, and PPVE is preferred.

As FAE, $CH_2=CF(CF_2)_2F$, $CH_2=CF(CF_2)_3F$, $CH_2=CF(CF_2)_4F$, $CH_2=CF(CF_2)_5F$, $CH_2=CF(CF_2)_6F$, $CH_2=CF(CF_2)_2H$, $CH_2=CF(CF_2)_3H$, $CH_2=CF(CF_2)_4H$, $CH_2=CF(CF_2)_5H$, $CH_2=CF(CF_2)_6H$, $CH_2=CH(CF_2)_2F$ (hereinafter referred to also as "PFEE"), $CH_2=CH(CF_2)_3F$, $CH_2=CH(CF_2)_4F$ (hereinafter referred to also as "PFBE"), $CH_2=CH(CF_2)_5F$, $CH_2=CH(CF_2)_6F$, $CH_2=CH(CF_2)_2H$, $CH_2=CH(CF_2)_3H$, $CH_2=CH(CF_2)_4H$, $CH_2=CH(CF_2)_5H$, or $CH_2=CH(CF_2)_6H$ may be exemplified, and PFBE or PFEE is preferred.

As the fluoromonomer having a ring structure, perfluoro(2,2-dimethyl-1,3-dioxole), 2,2,4-trifluoro-5-trifluoromethoxy-1,3-dioxole, or perfluoro(2-methylene-4-methyl-1,3-dioxolane) may be exemplified.

As the fluorovinyl ether having a functional group, $CF_2=CFOCF_2CF(CF_3)OCF_2CF_2SO_2F$, $CF_2=CFOCF_2CF_2SO_2F$, $CF_2=CFOCF_2CF(CF_3)OCF_2CF_2SO_3H$, $CF_2=CFOCF_2CF_2SO_3H$, $CF_2=CFO(CF_2)_3COOCH_3$, or $CF_2=CFO(CF_2)_3COOH$ may be mentioned.

As the fluoro(divinyl ether), $CF_2=CFCF_2CF_2OCF=CF_2$, or $CF_2=CFCF_2OCF=CF_2$ may be mentioned.

As the TFE type polymer, a copolymer of TFE and PAVE (hereinafter referred to also as "PFA"), or a copolymer of TFE and HFP (hereinafter referred to also as "FEP"), is preferred.

The content of PAVE units in PFA is preferably from 1 to 10 mol %, particularly preferably from 2 to 6 mol %, to the total amount of TFE units and PAVE units. The content of HFP units in FEP is preferably from 1 to 30 mol %, particularly preferably from 5 to 25 mol %, to the total amount of TFE units and HFP units.

The TFE type polymer may be a polymer containing units (hereinafter referred to also as "units H") based on a monomer having no fluorine atom (hereinafter referred to also as a "monomer H"), or may be a polymer not containing units H.

Units H are easily carbonizable when heated, as compared to units based on a fluoromonomer, whereby it is easy to adjust the extinction coefficient ($\alpha$ or $\beta$) of the molded product. The TFE type polymer is preferably a polymer containing units H. The units H may be of one type or may be of two or more types.

As the units H, units (hereinafter referred to also as "functional units H") based on a monomer H having a functional group (hereinafter referred to as a "functional monomer H") not containing a fluorine atom, units based on an olefin (such as ethylene), or units based on a vinyl ester (such as vinyl acetate) may be exemplified.

As the units H, the functional units H are preferred, since they are easily carbonizable when heated, it is thereby easy to adjust the extinction coefficient ($\alpha$ or $\beta$) of the molded product, and they exhibit adhesiveness with other substrates.

The functional group which the functional monomer H has, is preferably a carbonyl group-containing group, from such a viewpoint that it is thereby easy to adjust the extinction coefficient ($\alpha$ or $\beta$) of the molded product, and it exhibits adhesiveness to other substrates. As the carbonyl group-containing group, a keto group, a carbonate group, a carboxy group, a haloformyl group, an alkoxycarbonyl group, or an acid anhydride group may be exemplified. Here, the "acid anhydride group" means a group represented by —C(═O)—O—C(═O)—.

The keto group is preferably contained between carbon atoms in an alkylene group having from 2 to 8 carbon atoms. The number of carbon atoms in the alkylene group is the number of carbon atoms, which does not contain carbon atoms of the keto group.

As the haloformyl group, —C(═O)F, —C(═O)Cl, —C(═O)Br, or —C(═O)I, may be exemplified, and —C(═O)F is preferred.

The alkoxy group in the alkoxycarbonyl group is preferably an alkoxy group having from 1 to 8 carbon atoms, and a methoxy group or an ethoxy group is particularly preferred.

As the carbonyl group-containing group, an acid anhydride group or a carboxy group is preferred.

As the functional monomer H, a monomer having a carboxy group such as maleic acid, itaconic acid, citraconic acid or undecylenic acid, a monomer having an acid anhydride group such as itaconic anhydride (hereinafter referred to also as "IAH"), citraconic anhydride (hereinafter referred to also as "CAH"), 5-norbornene-2,3-dicarboxylic anhydride (hereinafter referred to also as "NAH") or maleic anhydride, a hydroxyalkyl vinyl ether, or an epoxy alkyl vinyl ether, may be exemplified, and a monomer having a carboxy group or a monomer having an acid anhydride group is preferred.

As the monomer having an acid anhydride group, IAH, CAH or NAH is preferred.

As the functional monomer, one type may be used alone, or two or more types may be used in combination.

The TFE type polymer containing units based on a functional monomer H may be a TFE type polymer comprising TFE units, functional units H and units based on a fluoromonomer other than TFE.

As the above TFE type polymer, a copolymer of TFE, NAH and PPVE, a copolymer of TFE, IAH and PPVE, a copolymer of TFE, CAH and PPVE, a copolymer of TFE, IAH and HFP, a copolymer of TFE, CAH and HFP, a copolymer of TFE, IAH, PFBE and ethylene, a copolymer of TFE, CAH, PFBE and ethylene, a copolymer of TFE, IAH, PFEE and ethylene, a copolymer of TFE, CAH, PFEE and ethylene, or a copolymer of TFE, IAH, HFP, PFBE and ethylene, may be exemplified.

Here, in a TFE type polymer containing units based on a monomer having an acid anhydride group, there may be a case where units having 1,2-dicarboxylic acid groups formed by hydrolysis of some of acid anhydride groups, are contained.

The proportion of functional units H in the TFE type polymer is preferably at most 1.0 mol %, more preferably at most 0.5 mol %, further preferably at most 0.3 mol %, to all units. The proportion of units H can be measured by a method such as a nuclear magnetic resonance analysis, an infrared absorption spectrum analysis, etc. For example, it is possible to utilize the method described in JP-A-2007-314720.

The shape of the molded product may be a film-like (self-supporting film), or it may be one formed in a layer or coating film on another substrate.

An article containing the molded product may be a film (single film), a metal-clad laminate having a layer of the molded product and a conductive metal layer, or a printed wiring board having a layer of the molded product and a conductive metal layer, and having through holes in the thickness direction of the layers, to be obtainable by forming through holes in the thickness direction of the above layers of the metal-clad laminate.

The thickness of the film is preferably from 1 to 50 μm, more preferably from 2 to 25 μm. In such a case, it will be easy to produce a printed wiring board having a small transmission loss, and hole-forming processability of the film by UV-YAG laser will also be improved.

The production method of the present invention is a method which comprises heat-molding a material (hereinafter referred to also as a "precursor material") which contains a TFE type polymer and in which the content of components other than the TFE type polymer is at most 0.9 mass %, in an atmosphere with an oxygen concentration of less than 10,000 ppm, to produce a molded product (molded product of the present invention) in which the content of components other than the TFE type polymer is at most 0.9 mass %, and which has a wavelength region where the extinction coefficient becomes to be from 1.2 to 4.5, at from 200 to 380 nm.

A TFE type polymer usually does not have a wavelength region where the extinction coefficient becomes to be from 1.2 to 4.5, at from 200 to 380 nm. The inventors have found it possible to obtain a TFE type polymer having a wavelength region where the extinction coefficient becomes to be from 1.2 to 4.5 at from 200 to 380 nm, by heating such a TFE type polymer in an atmosphere with an oxygen concentration of less than a predetermined level, even without adding an additive (the above-mentioned another component, the same applies hereinafter).

The precursor material may consist of only the TFE type polymer, or may contain the TFE type polymer and components other than the TFE type polymer, and it is preferred that it consists of only the TFE type polymer. In such a case, not only the electrical characteristics of the molded product, but adhesion of the molded product to another substrate will be more excellent.

The precursor material consisting of only the TFE type polymer means that components other than the TFE type polymer are not contained as components forming the precursor material, and usually means that the content of additives in the precursor material is 0 mass %. Here, the precursor material is components to constitute the molded product, and components that do not remain in the molded product are not included in the components of the precursor material. The components that do not remain in the molded product may be a liquid medium which dissipates in the process for producing the molded product, and a thermally decomposable surfactant which is decomposed and diffused in the process for producing the molded product. Here, the liquid medium means a dispersion medium or a solvent such as water.

The content of additives in the precursor material is at most 0.9 mass %, preferably at most 0.5 mass %, more preferably at most 0.3 mass %, to the total mass of the precursor material.

The form at the time of heating the precursor material may be a melt-kneaded form or may be a layer (coating film) form formed by coating.

The temperature for the heat molding is preferably from (Tm−15) to (Tm+100°) C, more preferably from Tm to (Tm+80°) C. When the temperature is at least the lower limit value in the above range, it will be easy to control the extinction coefficient (especially α or β) of the molded product to be in a desired range. When the temperature is at most the upper limit value in the above range, it will be easy to suppress an increase of the extinction coefficient and a decrease in electrical characteristics of the molded product.

The time for the heat molding is preferably from 10 minutes to 48 hours, more preferably from 10 minutes to 24 hours.

As the heating source, hot air, infrared, or hot metal may be exemplified.

The oxygen concentration in the atmosphere for the heat molding is less than 10,000 ppm, preferably at most 5,000 ppm, particularly preferably at most 1,000 ppm, from the viewpoint of controlling cleavage of the main chain of the TFE type polymer by the reaction of oxygen and radicals generated by the heating, in the TFE type polymer. The lower limit of the oxygen concentration is usually 1 ppm.

The specific atmosphere may, for example, be under an atmospheric pressure condition in an inert gas atmosphere (nitrogen gas or the like) at an oxygen concentration of less than 10,000 ppm, or a reduced pressure atmosphere condition (less than 44 kPa) corresponding to an oxygen concentration of less than 10,000 ppm.

The reason as to why a molded product having a desired extinction coefficient (in particular α or β) is obtainable by the production method of the present invention, is not necessarily clear, but it is considered to be as follows.

The TFE type polymer undergoes thermal decomposition or denaturation at least in part by heating in the molding, and at that time, when the oxygen concentration is controlled to be in a predetermined range, carbonization of the TFE type polymer proceeds preferentially, whereby formation of carbon is promoted, and the resulting carbon is considered to be highly dispersed in the molded product. As a result, by the light-absorption of the carbon, not only a molded product having the desired extinction coefficient is obtainable, but also its laser processability is considered to be improved.

That is, because the carbon is highly dispersed, as compared with the case of adding carbon represented by carbon black in the TFE type polymer, it is considered that without impairing the physical properties of the TFE type polymer, it is possible to obtain a molded product having a desired extinction coefficient, suitable for processing by UV-YAG laser light. Further, if the oxygen concentration is not controlled to be in a predetermined range, in the heating of the TFE type polymer, a decarboxylation reaction of the TFE type polymer proceeds preferentially, and formation of carbon dioxide is promoted, whereby the physical properties of the molded product will not be improved.

This phenomenon becomes to be particularly remarkable to light with a wavelength of 355 nm or a wavelength 266 nm in a case where the TFE type polymer has a functional group susceptible to pyrolysis (the above-mentioned functional group, in particular a carbonyl-containing group). As a result, it is possible to obtain a molded product which has a desired α or β, and which is further suitable for processing by UV-YAG laser light.

The production method of the present invention may be a method of heating the precursor material in an atmosphere with an oxygen concentration of less than 10,000 ppm, to melt mold it into a film-shape, and thereby to obtain a film (self-supporting film).

As the method for melt molding, extrusion molding or inflation molding may be exemplified, and as the TFE type polymer is heated by a die used for extrusion molding or inflation molding, the precursor material is heated during molding, whereby the film is obtainable.

The heating temperature in the melt-molding is preferably from (Tm+60) to (Tm+100°) C, more preferably from (Tm+70) to (Tm+80°) C.

Otherwise, a film which contains the TFE type polymer and in which the content of components other than the TFE type polymer is at most 0.9 mass %, may be heat-molded in an atmosphere with an oxygen concentration of less than 10,000 ppm, to obtain a film having at least a region where the extinction coefficient at a wavelength of from 200 to 380 nm becomes to be from 1.2 to 4.5.

As a method for producing a film before the heating, a method of melt molding the precursor material into a film at a temperature where the extinction coefficient will not be at least 1.2, may be exemplified.

The temperature at the time of obtaining a film before the heating is preferably from Tm to (Tm+50°) C, more preferably from Tm to (Tm+30°) C.

As the heating apparatus of the film before the heating, an oven or a furnace may be exemplified.

The temperature at the time of heating the film before the heating is preferably from (Tm−15) to (Tm+100°) C, more preferably from Tm to (Tm+80°) C.

The heating time of the film before the heating is preferably from 10 minutes to 48 hours, more preferably from 10 minutes to 24 hours.

According to the present invention, by thermocompression bonding a molded product of the present invention (a film or the like) and a conductive metal foil, it is possible to produce a metal-clad laminate having a layer of the molded product and a conductive metal layer.

The production method of the present invention may be a method of applying a dispersion prepared by dispersing the precursor material in a liquid medium in a film shape, followed by heating in an atmosphere with an oxygen concentration of less than 10,000 ppm, to obtain a film.

The heating temperature is preferably from Tm to (Tm+100°) C, more preferably from Tm to (Tm+80°) C.

As the liquid medium, an organic solvent such as methyl ethyl ketone, N-methyl-2-pyrrolidinone or the like, or water, may be exemplified. As the liquid medium, one type may be used alone, or two or more types may be used in combination.

As the method for applying the dispersion, a gravure coating method, a micro gravure coating method, a gravure offset method, a knife coating method, a kiss coating method, a bar coating method, a die coating method, a fountain Mayer bar method, or a slot die coating method may be exemplified.

According to the present invention, by applying a liquid composition comprising the precursor material and a liquid medium to the surface of a conductive metal foil, and at the same time as removing the liquid medium, heating it in an atmosphere with an oxygen concentration of 10,000 ppm, to fuse the TFE type polymer to the conductive metal foil, it is possible to produce a metal-clad laminate having a conductive metal layer and a layer of the molded product of the present invention (hereinafter referred to also as a "molded layer").

The step of forming a layer of the TFE type polymer by removing the liquid medium by heating or the like from the film of the liquid composition formed by application of the liquid composition and the step of fusing the layer of the TFE type polymer to the conductor metal foil, may be carried out continuously. That is, removal of the liquid medium from the film of the liquid composition, and fusion of the layer of the TFE type polymer may be carried out continuously under heating.

The metal-clad laminate may contain another layer other than the conductive metal layer and the molded layer. As another layer, a heat resistant resin layer may be exemplified.

As the layer structure of the metal-clad laminate, a conductive metal layer/molded layer/heat-resistant resin layer, a conductive metal layer/molded layer/heat-resistant resin layer/molded layer/conductive metal layer, or a conductive metal layer/heat-resistant resin layer/molded layer/heat-resistant resin layer/conductive metal layer may be exemplified.

As the conductive metal layer, a metal foil, a metal film, a metal sheet or the like may be exemplified, and a copper foil is preferred. As the copper foil, a rolled copper foil or an electrolytic copper foil may be exemplified. The copper foil may have another layer formed, and specifically, an anti-corrosive layer of e.g. zinc chromate, or a barrier layer of e.g. nickel or cobalt, may be formed. Here, the barrier layer may be formed by plating, or it may be formed by chemical conversion treatment.

In order to improve the adhesion between the conductive metal layer and the molded layer, the surface of the conductive metal layer may be treated with a silane coupling agent. The silane coupling agent may be epoxysilane, aminosilane, vinylsilane, acryloxy silane, methacryloxy silane, ureido silane, mercapto silane, sulfide silane, or isocyanate silane, and acryloxy silane, methacryloxy silane, or epoxysilane, is preferred. As the silane coupling agent, one type may be used alone, or two or more types may be used in combination.

The conductive metal layer may be formed by electroless plating, sputtering, or a combination of electrolytic plating and sputtering.

$Rz_{JIS}$ at the surface on the side where the molded layer of the conductive metal layer is disposed, is preferably from 0.3 to 1.6. When $Rz_{JIS}$ is at least 0.3, delamination is less likely to occur between the conductive metal layer and the molded layer at the time of forming holes by UV-YAG laser. When $Rz_{JIS}$ is at most 1.6, an increase in transmission loss due to the roughness can be suppressed.

The thickness of the conductive metal layer is preferably from 3 to 18 μm, more preferably from 6 to 12 μm.

The dielectric loss tangent of the molded layer is preferably from 0.0005 to 0.0020, more preferably from 0.0007 to 0.0015. The lower the dielectric loss tangent, the better the electrical characteristics of the molded layer.

The thickness of the molded layer is preferably from 1 to 50 μm, more preferably from 2 to 25 μm. When the thickness of the molded layer is at least the lower limit value in the above range, a printed wiring board with a small transmission loss will be readily obtainable. When the thickness of the TFE layer is at most the upper limit value in the above range, processability by UV-YAG laser will be improved. In a case where there are a plurality of molded layers, it is preferred that the respective thicknesses will be made to be within the above range.

As a material for forming a heat-resistant resin layer, a polyimide, a liquid crystal polymer, a polyether ether ketone, a polyphenylene oxide, a polyester, a polyamide, or aramid fibers may be exemplified. Among them, at least one type selected from the group consisting of a polyimide, a liquid crystal polymer, a polyether ether ketone, a polyphenylene oxide, and aramid fibers, is preferred, and a polyimide or a liquid crystal polymer is more preferred.

As the heat-resistant resin, a polyimide film or a liquid crystal polymer film is preferred.

As the polyimide film, a non-thermoplastic aromatic polyimide film, or a film formed by applying a thermoplastic polyimide to a non-thermoplastic aromatic polyimide film, may be exemplified.

In the heat-resistant resin layer, different materials should better be small from the viewpoint of hole forming processability by a laser, and a single layer of a non-thermoplastic aromatic polyimide film is preferred.

In a case where the metal-clad laminate has a heat-resistant resin layer, the ratio of the total thickness of the molded layer to the total thickness of the heat-resistant resin layer is preferably from 0.5 to 2. When the ratio is at least the lower limit value in the above range, hole forming processability by a laser will be easy. When the ratio is at most the upper limit value in the above range, it will be easy to reduce a transmission loss.

The thickness of the metal-clad laminate is preferably from 10 to 150 μm, more preferably from 15 to 100 μm, further preferably from 20 to 50 μm. When the thickness of the laminate is at least the lower limit value in the above range, it can be used more stably as a printed wiring board. When the thickness of the laminate is at most the upper limit value in the above range, it will be easy to form a through hole by UV-YAG laser.

The printed wiring board of the present invention has a molded layer and a conductive metal layer, and has through-holes in the thickness direction of the molded layer.

As the opening shape of the through holes formed in the printed wiring board, a circular shape may be exemplified.

With respect to the size of the through holes, if the opening shape is circular, the diameter may, for example, be made to be in a range of from 0.05 to 0.10 mm.

The number of through-holes may be one or may be two or more.

On the inner wall surface of a through-hole, a plating layer may be formed as the case requires. For example, in a case where there are, respectively, conductors on both sides in the thickness direction of a printed wiring board, by forming a plating layer on the inner wall surface of a through hole, it is possible to secure conduction between the respective conductors.

As the plating layer, a copper plating layer, a gold plating layer, a nickel plating layer, a chrome plating layer, a zinc plating layer, or a tin plating layer may be exemplified.

A transmission loss is a parameter representing the attenuation of a signal from the input section to the output section of the signal in a printed wiring board.

The transmission loss of a printed wiring board is at least −0.07 dB/mm, more preferably at least −0.06 dB/mm, at 40 GHz.

As a method for producing a printed wiring board, a method of forming through holes in the metal-clad laminate of the present invention by hole forming processing by irradiation of UV-YAG laser, may be exemplified.

The wavelength of UV-YAG laser is preferably third harmonic wave (wavelength: 355 nm) or fourth harmonic wave (266 nm).

For the hole forming processing, a UV-YAG laser processing machine may be used. For the hole forming processing by UV-YAG laser, trepanning processing may be employed. Specifically, along the periphery of the portion where a through hole is desired to be formed, a laser with a focused diameter is irradiated while being circulated, whereby the metal-clad laminate will be partially hollowed out to form a through hole.

The output of the laser, the number of circulation while irradiating the laser, and the oscillation frequency of the laser may be set depending on the thickness of the laminate and may usually be from 0.01 to 3.0 W.

In the case of using a laser beam having a wavelength of 355 nm, the output of the laser is preferably from 0.1 to 3.0 W, more preferably from 0.5 to 2.0 W. In the case of using a laser beam having a wavelength of 266 nm, the output of the laser is preferably from 0.01 to 0.5 W, more preferably from 0.05 to 0.3 W. When the output of the laser is at least the lower limit value in the above range, formation of a through hole will be easy. When the output of the laser is at most the upper limit value in the above range, it is possible to reduce scattering of the resin by the heat of the laser.

The number of circulation of the laser irradiation is preferably from 5 to 50 times.

In the case of using a laser beam having a wavelength of 355 nm, the oscillation frequency of the laser is preferably from 20 to 80 kHz. In the case of using a laser beam having a wavelength of 266 nm, the oscillation frequency of the laser is preferably from 1 to 10 kHz.

In the present invention, the extinction coefficient of the molded layer of the printed wiring board is controlled to be in a predetermined range by heating. Accordingly, the UV-YAG laser absorption rate is increased even without using an additive, whereby it is possible to form through holes with a small diameter easily by using the UV-YAG laser, while suppressing a decrease in the electrical characteristics.

The printed wiring board of the present invention can be suitably used in high frequency applications.

EXAMPLES

Hereinafter, the present invention will be described specifically with reference to Examples, but the present invention is not limited by the following description.

The raw materials used are as follows.

Polymer A1: a copolymer of TFE, NAH and PPVE (copolymer composition: TFE units/NAH units/PPVE units=97.9/0.1/2.0 (molar ratio), melting point: 305° C., melt flow rate: 11.0 g/10 min) produced in accordance with the description in paragraphs [0111] to [0113] of WO2016/104297.

Polymer A2: a copolymer of TFE and PPVE having a carbonate group at the main chain terminal (copolymer composition: TFE units/PPVE units=98.0/2.0 (molar ratio), melting point: 310° C., melt flow rate: 11.0 g/10 min).

Composition B1: a composition obtained by kneading to 100 parts by mass of the polymer A1, 3 parts by mass of titanium oxide (manufactured by Sakai Chemical Industry Co., Ltd., R-25, rutile type, average particle size: 0.2 μm) and 2 parts by mass of triallyl isocyanurate (TAIC) by a twin-screw extruder at 320° C.

Composition B2: a composition obtained in the same manner as composition B1 except that to 100 parts by mass of polymer A1, titanium oxide was changed to 1 part by mass, and TAIC was changed to 0.5 part by mass.

Composition B3: a composition obtained by kneading 1 part by mass of carbon black to 100 parts by mass of polymer A1, by a twin-screw extruder at 320° C.

Copper foil C1: a rolled copper foil having a thickness of 12 μm (ROFL-T49A-12, manufactured by Fukuda Metal Foil Powder Co., Ltd., surface roughness $Rz_{JIS}$: 0.6 μm).

Film D1: a polyimide film having a thickness of 25 μm (Kapton 100EN, manufactured by Du Pont-Toray Co., Ltd.).

Film D2: a polyimide film having a thickness of 7.5 μm (Kapton 30EN, manufactured by Du Pont-Toray Co., Ltd.).

Dispersion E1: a dispersion obtained by dispersing a powder of polymerA1 (average particle size: 2 to 3 μm) in methyl ethyl ketone so that said powder becomes to be 50 mass %. Here, to the dispersion, before introducing the powder, Surflon (tradename: S231, manufactured by AGC Seimi Chemical Co., Ltd.) as a surfactant, was added in a proportion of 1 part by mass to 100 parts by mass of the powder of polymer A1. Here, the surfactant added is a thermally decomposable surfactant.

Dispersion E2: a dispersion obtained by further dispersing to the dispersion E1, 3 parts by mass of titanium oxide (manufactured by Sakai Chemical Industry Co., Ltd., R-25, rutile type, average particle size: 0.2 μm) and 2 parts by mass of TAIC to 100 parts by mass of its polymer A1.

[Ex. 1]

[Ex. 1-1]

Using a 65 mmφ single screw extruder having a coat hanger die of 750 mm in width, polymer A1 was extrusion-molded in a film-form at a die temperature of 370° C. under a nitrogen gas atmosphere having an oxygen concentration of 500 ppm, to obtain a film F1 having a thickness of 12 μm. Of the film F1, the extinction coefficient α was 1.6, the extinction coefficient β was 2.6, and the dielectric loss tangent was 0.0010.

[Ex. 1-2 to Ex. 1-8]

Film F2 to film F8 were, respectively, obtained in the same manner as in Ex. 1-1, except that the type of the polymer and the film forming conditions (thickness of the film, and the die temperature and atmosphere (oxygen concentration) at the time of extrusion molding), were changed as shown in Table 1. The type of the polymer and film forming conditions in each Ex., and the physical properties of the obtained film are summarized in Table 1. Here, in the films F1 to F4, the content of components other than the polymer was at most 0.9 mass %.

TABLE 1

| | | | | Forming conditions and physical properties of the film | | | | |
| --- | --- | --- | --- | --- | --- | --- | --- | --- |
| Ex. | Film No. | Type of polymer | Die temperature | Atomosphere (oxygen concentration) | Thickness | α | β | Dielectric loss tangent |
| 1-1 | F1 | A1 | 370° C. | 500 ppm | 12 μm | 1.6 | 2.6 | 0.0010 |
| 1-2 | F2 | A1 | 370° C. | 500 ppm | 25 μm | 1.6 | 2.6 | 0.0010 |
| 1-3 | F3 | A2 | 370° C. | 500 ppm | 12 μm | 1.2 | 1.8 | 0.0010 |
| 1-4 | F4 | A1 | 340° C.* | 500 ppm | 12 μm | 1.6 | 2.6 | 0.0010 |
| 1-5 | F5 | A1 | 400° C. | 500 ppm | 12 μm | 2.0 | 3.5 | 0.0020 |
| 1-6 | F6 | A1 | 420° C. | 500 ppm | 12 μm | 2.2 | 4.7 | 0.0023 |
| 1-7 | F7 | A1 | 370° C. | 10,000 ppm | 12 μm | 0.9 | 1.1 | 0.0010 |
| 1-8 | F8 | A1 | 340° C. | 10,000 ppm | 12 μm | 0.8 | 1.0 | 0.0010 |

*Further calcined in an oven under nitrogen atmosphere at 290° C. for 24 hours.

[Ex. 1-9 to Ex. 1-11]

Film F9 to film F11 were, respectively, obtained in the same manner as in Ex. 1-1 except that the material and the die temperature at the time of the extrusion molding were changed as shown in Table 2. The material for the film and the die temperature at the time of the extrusion molding in each Ex., and the physical properties of the obtained film are summarized in Table 2.

TABLE 2

| | | | Forming conditions and physical properties of the film | | | |
| --- | --- | --- | --- | --- | --- | --- |
| Ex. | Film No. | Material for film | Die temperature | α | β | Dielectric loss tangent |
| 1-9 | F9 | Composition B1 | 340° C. | 4.5 | 8.0 | 0.0030 |
| 1-10 | F10 | Composition B2 | 340° C. | 2.0 | 3.2 | 0.0025 |
| 1-11 | F11 | Composition B3 | 340° C. | 2.0 | 3.2 | 0.0025 |

[Ex. 2]
[Ex. 2-1]

Copper foil C1, film F1, film D1, film F1, copper foil C1 were superimposed in this order, and vacuum-pressed at 320° C. for 30 minutes, to obtain a laminate 1 (double-sided copper-clad laminate) having a layer structure of copper foil C1/film F1/film D1/film F1/copper foil C1. The total thickness of the laminate 1 was 72 μm.

To the laminate 1, hole forming processing was applied by a UV-YAG laser (wavelength: 355 nm or 266 nm) machine, and its processing quality and the transmission loss of the processed product were evaluated.

Here, as the UV-YAG laser processing machine having a wavelength of 355 nm, esi5330 was used. In that processing, the laser was irradiated while circulating it on a circumference with a diameter 100 μm, to let the laminate be partially hollowed circularly to form a through hole. The laser power was 1.5 W, the laser focal diameter was 25 μm, the number of circulation on the circumference was 16 times, and the oscillation frequency was 40 kHz.

Here, as the UV-YAG laser processing machine having a wavelength of 266 nm, UVTS-4500-Exp (Takano Co., Ltd.) was used. In that processing, the laser was irradiated while circulating it on the circumference with a diameter 100 μm, to let the laminate be partially hollowed circularly to form a through hole. The laser power was 0.2 W, the laser focus diameter was 25 μm, the number of circulation on the circumference was 15 times, and the oscillation frequency was 5 kHz.

[Ex. 2-2 to Ex. 2-14]

The processing quality and the transmission loss of the obtainable processed product were evaluated in the same manner as in Ex. 2-1, except that the type of film F, the total thickness of the laminate, and the processing conditions (the laser power and the number of circulation) in the UV-YAG laser processing were changed as shown in Table 3. In each laminate, the material and processing conditions, and the processing quality and transmission loss, are summarized in Table 3.

[Quality in Hole Forming Processing]

From a laminate after hole forming processing (laser processing), a fragment containing a hole was cut out, and solidified with a thermosetting epoxy resin. Then, it was polished until the cross-section of the hole was exposed, and the cross section of the portion at which the hole was formed, was observed by a microscope and evaluated by the following standards.

(Hole Through)

⊚: The hole extends through, and no step is observed in the cross-section.

◯: The hole extends through.

Δ: Although the hole extends through, the opening diameter at the lower end of the hole is smaller by at least 10 μm than the opening diameter at the upper end.

x: The hole does not extend through.

(Peeling)

In the cross section of the portion where the hole is formed, the presence or absence of peeling was confirmed between layers among the conductor (copper foil), the polymer layer and the heat-resistant resin layer (polyimide layer).

◯: Peeling is not observed at all.

Δ: Peeling in a length of less than 5 μm is observed.

x: Peeling in a length of at least 5 μm is observed.

Figure 1:
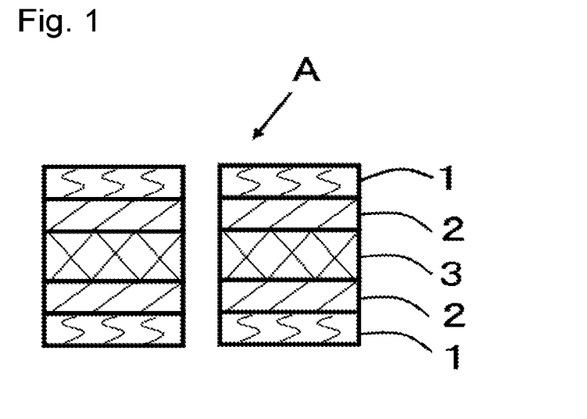
FIG. 1 is a cross-sectional view of a double-sided copper clad laminate after UV-YAG laser processing, wherein a hole extends through with no level difference in the cross section, in an Example.
Figure 2:
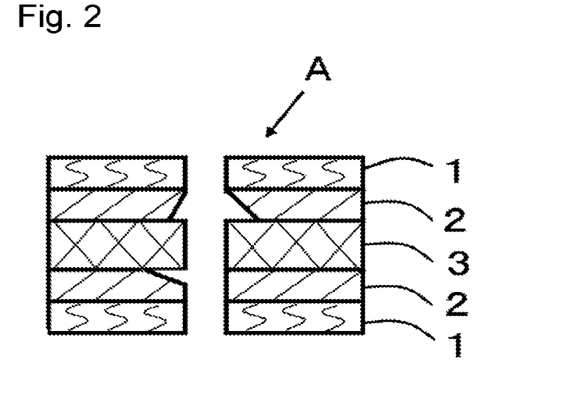
FIG. 2 is a cross-sectional view of a double-sided copper clad laminate after UV-YAG laser processing, wherein a hole extends through, and peeling of the polymer layer is observed in the cross section at the portion where the hole is formed, in an Example.
Figure 3:
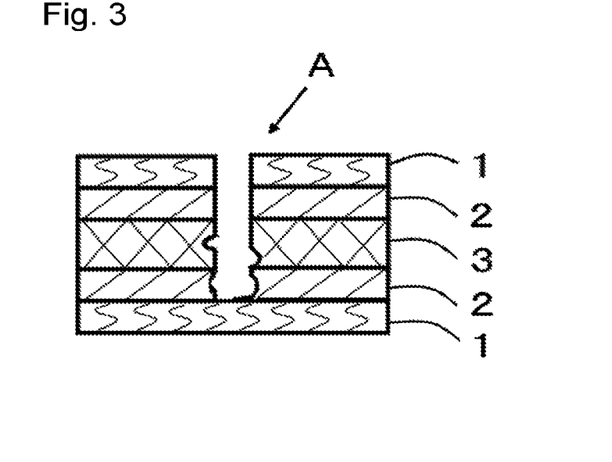
FIG. 3 is a cross-sectional view of a double-sided copper clad laminate after UV-YAG laser processing, wherein a hole does not extend through, in an Example.

Examples of the cross-section of a double-sided copper clad laminate after hole forming processing are shown in FIGS. 1 to 3. A double-sided copper-clad laminate A is a laminate comprising a five-layer structure of copper foil 1/film F layer 2/film D layer 3/film F layer 2/copper foil 1, and FIGS. 1 to 3 are cross-sectional views of the double-sided copper-clad laminate A after YAG laser processing.

FIG. 1 is an example of a double-sided copper-clad laminate A wherein a hole extends through with no step in the cross section, and no peeling is observed at all. FIG. 2 is an example of a double-sided copper-clad laminate A wherein a hole extends through, but peeling of at least 5 μm is observed. FIG. 3 is an example of a double-sided copper-clad laminate A wherein not only a hole does not extend through, but also peeling of at least 5 μm is observed.

[Measurement of Transmission Loss]

From each laminate, a microstrip line was formed with a line length of 100 mm. The conductor width was decided so that the characteristic impedance $Z_0$ is adjusted to be 50Ω from the following formula (3).

Using a network analyzer E8361A (manufactured by Agilent Technologies) and a jig GK-HL10 (manufactured by YOKOWO DS), the transmission loss (dB/mm) at 40 GHz was measured.

$$Z_0 = \left(\frac{87}{\sqrt{\varepsilon_r + 1.414}}\right) \ln\left(\frac{5.98h}{0.8w} + t\right) \quad (3)$$

Here, the symbols in the formula (3) have the following meanings.

$Z_0$: characteristic impedance $\varepsilon_r$: dielectric constant of the dielectric layer (the polymer layer) of the laminate h: thickness (mm) of the dielectric layer (the polymer layer)

w: width (mm) of the conductor (the copper foil)

t: thickness (mm) of the conductor (the copper foil)

perature in the heating and the atmosphere (oxygen concentration)) for the laminate were changed as shown in Table 4. The material for the laminate, the film forming conditions and the physical properties of the obtained film in each case, are summarized in Table 4. Here, in the film in Ex. 3-1 obtained from dispersion E1, the content of components other than the polymer was at most 0.9 mass %.

TABLE 4

| | | Molding conditions and physical properties of laminate | | | | | |
|---|---|---|---|---|---|---|---|
| Ex. | Laminate No. | Material for laminate | Heating temperature | Atmosphere (oxygen concentration) | α | β | Dielectric loss tangent |
| 3-1 | 15 | Dispersion E1 | 370° C. | 500 ppm | 1.6 | 2.6 | 0.0010 |
| 3-2 | 16 | Dispersion E1 | 340° C. | 10,000 ppm | 0.8 | 1.2 | 0.0010 |
| 3-3 | 17 | Dispersion E2 | 340° C. | 500 ppm | 4.5 | 8.0 | 0.0030 |

TABLE 3

| | | | | UV-YAG processing (wavelength: 355 nm) | | | UV-YAG processing (wavelength: 266 nm) | | |
|---|---|---|---|---|---|---|---|---|---|
| | | | Total thickness of | Processing conditions | | Processing qulaity | Processing quality | | Transmission |
| Ex. | Laminate No. | Type of film | laminate [μm] | Laser power | Number of circulation | Hole extending through | Peeling | Hole extending through | Peeling | loss (40 GHz) [dB/mm] |
| 2-1 | 1 | F1 | 72 | 1.5 W | 16 times | ○ | ○ | ◎ | ○ | −0.06 |
| 2-2 | 2 | F3 | 72 | 1.5 W | 16 times | ○ | Δ | ○ | Δ | −0.06 |
| 2-3 | 3 | F4 | 72 | 1.5 W | 16 times | ○ | ○ | — | — | −0.06 |
| 2-4 | 4 | F5 | 72 | 1.5 W | 16 times | ○ | ○ | ◎ | ○ | −0.07 |
| 2-5 | 5 | F6 | 72 | 1.5 W | 16 times | ○ | ○ | — | — | −0.10 |
| 2-6 | 6 | F7 | 72 | 1.5 W | 16 times | x | ○ | x | ○ | −0.06 |
| 2-7 | 7 | F8 | 72 | 1.5 W | 16 times | x | ○ | — | — | −0.06 |
| 2-8 | 8 | F9 | 72 | 1.5 W | 16 times | ○ | ○ | — | — | −0.10 |
| 2-9 | 9 | F10 | 72 | 1.5 W | 16 times | ○ | ○ | — | — | −0.12 |
| 2-10 | 10 | F11 | 72 | 1.5 W | 16 times | ○ | ○ | — | — | −0.15 |
| 2-11 | 11 | F2 | 100 | 1.5 W | 16 times | ○ | ○ | ◎ | ○ | −0.06 |
| 2-12 | 12 | F1 | 72 | 3.0 W | 8 times | ○ | Δ | — | — | −0.06 |
| 2-13 | 13 | F6 | 72 | 3.0 W | 8 times | x | Δ | — | — | −0.10 |
| 2-14 | 14 | F6 | 72 | 4.0 W | 6 times | ○ | x | — | — | −0.10 |

[Ex. 3]

[Ex. 3-1]

On one side of copper foil C1, dispersion E1 was applied by die coating and heated at 370° C. under a reduced pressure atmosphere with an oxygen concentration of at most 500 ppm, to prepare a laminate 15 (copper-clad laminate). The thickness of the polymer layer of copper-clad laminate G1 was set to be 3 μm. Of the polymer layer of the laminate 15, the extinction coefficient α was 1.6, the extinction coefficient β was 2.6, and the dielectric loss tangent was 0.0010. Here, the extinction coefficient α and the dielectric loss tangent of the polymer layer of the laminate 15 were measured by removing the copper foil by etching.

[Ex. 3-2 and Ex. 3-3]

A laminate 16 and a laminate 17 were, respectively, obtained in the same manner as in Ex. 3-1 except that the material for the laminate, the molding conditions (the tem-

[Ex. 4]

The laminate 15, the film D2, and the laminate 15 were superimposed in this order so that the polymer layer of the laminate 15 was in contact with the film D2, and vacuum-pressed at 320° C. for 30 minutes, to obtain a laminate 15' having a layer structure of the laminate 15/the film D2/the laminate 15. The thickness of the laminate 15' was 37.5 μm. In the same manner except for changing the laminate, the laminate 16' was obtained from the laminate 16, and the laminate 17' was obtained from the laminate 17.

With respect to each laminate, evaluation was conducted in the same manner as in Ex. 2-1 except for changing the processing conditions (the laser power and the number of circulation) in the UV-YAG laser processing as shown in Table 5. The results are summarized in Table 5.

TABLE 5

| Ex. | Laminate No. | Laser power | Number of ciculation | Hole extending through | Peeling | Tramsmission loss (40 GHz) [dB/mm] |
|---|---|---|---|---|---|---|
| 4-1 | 15' | 0.8 W | 16 times | ○ | ○ | −0.06 |
| 4-2 | 16' | 0.5 W | 10 times | ○ | x | −0.06 |
| 4-3 | 17' | 0.5 W | 10 times | ○ | ○ | −0.12 |

Column group header: UV-YAG processing (wavelength: 355 nm) — Processing conditions (Laser power, Number of ciculation); Processing quality (Hole extending through, Peeling).

INDUSTRIAL APPLICABILITY

The molded product of the present invention can easily be bored by UV-YAG laser, and it is useful as a material for a printed wiring board.

This application is a continuation of PCT Application No. PCT/JP2018/039747, filed on Oct. 25, 2018, which is based upon and claims the benefit of priority from Japanese Patent Application No. 2017-210717 filed on Oct. 31, 2017 and Japanese Patent Application No. 2018-147115 filed on Aug. 3, 2018. The contents of those applications are incorporated herein by reference in their entireties.

REFERENCE SYMBOLS

A: Double-sided copper-clad laminate, 1: copper foil layer, 2: film F layer, 3: film D layer.

What is claimed is:

1. A method for producing a film, comprising:
heat-molding a material which comprises a melt-moldable tetrafluoroethylene type polymer comprising at least one functional group selected from the group consisting of a carbonyl group-containing group, a hydroxy group, an epoxy group, an amide group, an amino group, and an isocyanate group, and in which the content of components other than the melt-moldable tetrafluoroethylene type polymer is at most 0.9 mass %, at a temperature of from (Tm−15) to (Tm+100)° C. wherein Tm is a melting point of the melt-moldable tetrafluoroethylene type polymer and is from 100 to 325° C., in an atmosphere consisting of nitrogen and optionally less than 10,000 ppm of oxygen, to produce a film in which the content of said-components other than the melt-moldable tetrafluoroethylene type polymer is at most 0.9 mass % and which has a wavelength region where the extinction coefficient becomes to be from 1.2 to 4.5, at from 200 to 380 nm.

2. The method according to claim 1, wherein the heat-molding is conducted in an atmosphere having an oxygen concentration of at most 1,000 ppm.

3. The method according to claim 1, wherein the film has an extinction coefficient of from 1.2 to 2.0 at a wavelength of 355 nm, or an extinction coefficient of from 2.0 to 4.5 at a wavelength of 266 nm.

4. A method for producing a metal-clad laminate, comprising:
producing a film by the method of claim 1; and
thermocompression bonding a conductive metal foil and the film, to produce a metal-clad laminate having a conductive metal layer and a layer of the film.

5. A method for producing a metal-clad laminate, comprising:
applying, on the surface of a conductive metal foil, a liquid composition comprising a liquid medium and a material which comprises a melt-moldable tetrafluoroethylene type polymer comprising at least one functional group selected from the group consisting of a carbonyl group-containing group, a hydroxy group, an epoxy group, an amide group, an amino group, and an isocyanate group, and in which the content of components other than the melt-moldable tetrafluoroethylene type polymer is at most 0.9 mass %; and
removing the liquid medium and, at the same time, heating in an atmosphere consisting of nitrogen and optionally less than 10,000 ppm of oxygen and having a temperature of from Tm to (Tm+100)° C. wherein Tm is a melting point of the melt-moldable tetrafluoroethylene type polymer and is from 100 to 325° C., to let the melt-moldable tetrafluoroethylene type polymer be fusion-bonded to the conductive metal foil, to produce a metal-clad laminate having a conductive metal layer and a layer of a film in which the content of components other than the melt-moldable tetrafluoroethylene type polymer is at most 0.9 mass %, and which has a wavelength region where the extinction coefficient becomes to be from 1.2 to 4.5, at from 200 to 380 nm.

6. A method for producing a printed wiring board, comprising:
producing a metal-clad laminate by the method of claim 5; and
irradiating the metal-clad laminate with UV-YAG laser to form through holes in a thickness direction of the metal-clad laminate.

7. The method according to claim 1, wherein the atmosphere in which the heat-molding is conducted consists of nitrogen and optionally at most 5,000 ppm of oxygen.

8. The method according to claim 1, wherein the atmosphere in which the heat-molding is conducted consists of nitrogen and optionally at most 1,000 ppm of oxygen.

9. The method according to claim 5, wherein the atmosphere in which the heating is conducted consists of nitrogen and optionally at most 5,000 ppm of oxygen.

10. The method according to claim 5, wherein the atmosphere in which the heating is conducted consists of nitrogen and optionally at most 1,000 ppm of oxygen.

11. The method according to claim 1, wherein the film has a thickness of from 1 to 50 μm.

12. The method according to claim 1, wherein the film has a thickness of from 2 to 25 μm.

13. The method according to claim 5, wherein the film has a thickness of from 1 to 50 μm.

14. The method according to claim 5, wherein the film has a thickness of from 2 to 25 μm.

* * * * *